United States Patent
Cheng et al.

(10) Patent No.: US 8,710,588 B2
(45) Date of Patent: Apr. 29, 2014

(54) IMPLANT FREE EXTREMELY THIN SEMICONDUCTOR DEVICES

(75) Inventors: Kangguo Cheng, Albany, NY (US); Bruce B. Doris, Albany, NY (US); Dechao Guo, Hopewell Junction, NY (US); Pranita Kulkarni, Albany, NY (US); Philip J. Oldiges, Hopewell Junction, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/595,025

(22) Filed: Aug. 27, 2012

(65) Prior Publication Data

US 2013/0056802 A1    Mar. 7, 2013

Related U.S. Application Data

(62) Division of application No. 12/621,299, filed on Nov. 18, 2009, now Pat. No. 8,304,301.

(51) Int. Cl.
*H01L 27/12* (2006.01)

(52) U.S. Cl.
USPC ............ 257/347; 257/E21.411; 257/E29.285; 438/163

(58) Field of Classification Search
None
See application file for complete search history.

(56) References Cited

U.S. PATENT DOCUMENTS

| | | | |
|---|---|---|---|
| 4,108,686 A * | 8/1978 | Jacobus, Jr. ................. | 438/291 |
| 6,963,090 B2 | 11/2005 | Passlack et al. | |
| 7,015,147 B2 | 3/2006 | Lee et al. | |
| 7,018,882 B2 | 3/2006 | Tweet et al. | |
| 7,256,077 B2 | 8/2007 | Orlowski | |
| 2005/0260816 A1 | 11/2005 | Orlowski | |
| 2007/0128786 A1 | 6/2007 | Cheng et al. | |
| 2009/0039426 A1 * | 2/2009 | Cartier et al. ................. | 257/344 |

(Continued)

FOREIGN PATENT DOCUMENTS

| | | |
|---|---|---|
| FR | 2799307 A1 | 4/2001 |
| FR | 2 856 521 A1 | 12/2004 |
| WO | 2009052224 A2 | 4/2009 |

OTHER PUBLICATIONS

Jurczak, et al., "Silicon-on-Nothing (SON)—an Innovative Process for Advanced CMOS", IEETrans. El. Dev. vol. 47, pp. 2179-2187, 2000.

(Continued)

*Primary Examiner* — Sonya D McCall Shepard
(74) *Attorney, Agent, or Firm* — Scully Scott Murphy & Presser PC; Vazken Alexanian (57) ABSTRACT

A semiconductor device and a method of fabricating a semiconductor device are disclosed. In one embodiment, the method comprises providing a semiconductor substrate, epitaxially growing a Ge layer on the substrate, and epitaxially growing a semiconductor layer on the Ge layer, where the semiconductor layer has a thickness of 10 nm or less. This method further comprises removing at least a portion of the Ge layer to form a void beneath the Si layer, and filling the void at least partially with a dielectric material. In this way, the semiconductor layer becomes an extremely thin semiconductor-on-insulator layer. In one embodiment, after the void is filled with the dielectric material, in-situ doped source and drain regions are grown on the semiconductor layer. In one embodiment, the method further comprises annealing said source and drain regions to form doped extension regions in the semiconductor layer.

20 Claims, 7 Drawing Sheets

SOI EMBODIMENT

(56) References Cited

U.S. PATENT DOCUMENTS

2009/0146181 A1   6/2009   Lai et al.
2009/0170223 A1   7/2009   Pal et al.
2009/0179231 A1   7/2009   Ramaswamy et al.

OTHER PUBLICATIONS

Skotnicki, "Silicon on Nothing (SON)—Fabrication, Material and Devices", Eletrochemical Society Proceedings, vol. 2001-3, Mar. 25, 2001, pp. 391-402, XP008014133.

International Search Report dated Jan. 17, 2011.

* cited by examiner

FIG. 2b SOI EMBODIMENT

FIG. 1b BULK EMBODIMENT

FIG. 2g
SOI EMBODIMENT

FIG. 1g
BULK EMBODIMENT

- THERMAL ANNEALING TO DRIVE THE DOPANT FROM THE IN-SITU DOPED S/D REGION INTO EXTENSION

IMPLANT FREE EXTREMELY THIN SEMICONDUCTOR DEVICES

CROSS REFERENCE TO RELATED APPLICATION

This application is a divisional of copending U.S. patent application Ser. No. 12/621,299, filed Nov. 18, 2009, the entire content and disclosure of which is hereby incorporated herein by reference.

BACKGROUND OF THE INVENTION

1. Field of the Invention

The present invention generally relates to the field of semiconductors, and more particularly relates to extremely-thin silicon-on-insulator field-effect transistors having extremely-thin silicon layers, and a method of fabricating the same.

2. Background Art

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device.

With conventional planar FET scaling reaching fundamental limits, the semiconductor industry is looking at more unconventional geometries that will facilitate continued device performance improvements. As a result, attention has been given to using FETs with extremely thin silicon layers where the silicon or "device" layer has a thickness of from about seven nm and about ten nm. When used with FETs having silicon on oxide, these devices are referred to as extremely thin silicon on oxide (ETSOI) devices. Extremely thin silicon layer technology can also be used with bulk wafers.

ETSOI devices have very substantial advantages, however they also present difficult challenges. For instance, these devices can experience threshold-voltage and subthreshold slope fluctuation because of Si thickness variations across the wafer. For example, a typical SOI device may have a silicon layer thickness of from 4-8 nanometers (nm), with a variation of 1 or more nm across the wafer.

Also, it has been determined that when implanting dopants into semiconductor layers that have a thickness of 10 nm or less, the ion implantation amorphizes the semiconductor layer. Recrystallizing the amorphous semiconductor layer is difficult, because of the limited amount of crystal seed layer that is available in semiconductor layers having a thickness of less than 10 nm that have been ion implanted into an amorphous crystal structure. The presence of an amorphous semiconductor material in a semiconductor device results in the semiconductor device having a high external resistance. Further, the resistance of the semiconductor device is increased by defects in the semiconductor layer that are produced by ion implantation. The ion implantation may also damage the gate dielectric.

BRIEF SUMMARY

Embodiments of the invention provide a semiconductor device and a method of fabricating a semiconductor device. In one embodiment, the method comprises providing a semiconductor substrate, epitaxially growing a germanium-containing (Ge) layer on the substrate, and epitaxially growing a semiconductor layer on the germanium-containing (Ge) layer, where the semiconductor layer has a thickness of 10 nm or less. This method further comprises removing at least a portion of the Ge layer to form a void beneath the semiconductor layer, and filling the void at least partially with a dielectric material. In this way, the semiconductor layer becomes an extremely thin semiconductor-on-insulator layer.

Epitaxially growing the extremely thin semiconductor layer on the Ge layer ensures good thickness control across the wafer. This process could be used for SOI or bulk wafers.

In one embodiment, after the void is filled with the dielectric material, in-situ doped source and drain regions are grown on the semiconductor layer. In one embodiment, the method further comprises annealing said source and drain regions to form doped extension regions in the semiconductor layer.

In one embodiment, the removing includes dissolving said at least a portion of the Ge layer. In an embodiment, said removing includes etching away at least a part of the Ge layer.

In an embodiment, the method further comprises forming isolation regions in the substrate, and anchoring the semiconductor layer at said isolation regions while removing said at least a portion of the Ge layer.

In one embodiment, the semiconductor layer is comprised of Si. In an embodiment, the Ge layer is comprised of SiGe. In one embodiment, the dielectric material may be or include a single dielectric material; and in another embodiment, the dielectric material may be or include a multi-layer dielectric material.

BRIEF DESCRIPTION OF THE SEVERAL VIEWS OF THE DRAWINGS

FIGS. 1b and 2b show spacers formed on the gates of the structures shown in FIGS. 1a and 2a.

FIGS. 1c and 2c depict shallow trench isolation regions that may be formed in the substrates of FIGS. 1a and 2a.

FIGS. 1d and 2d illustrate etching or dissolving the SiGe layers of the structures of FIGS. 1a and 2a.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a method for forming a planar semiconductor device on a semiconductor on insulator (SOI) substrate having an extremely thin semiconductor on insulator (ETSOI) layer. An extremely thin semiconductor on insulator (ETSOI) layer is the semiconductor layer that is present atop the buried insulating layer of an SOI substrate, wherein the ETSOI layer has a thickness of 10 nm or less. In accordance with an embodiment of the present invention, source and drain extension regions are formed in the ETSOI layer using an in situ doped epitaxial growth process followed by an annealing process to drive the dopant from the in-situ doped epitaxial semiconductor material into the ETSOI layer to provide extension regions without utilizing ion implantation.

Figure 1A:
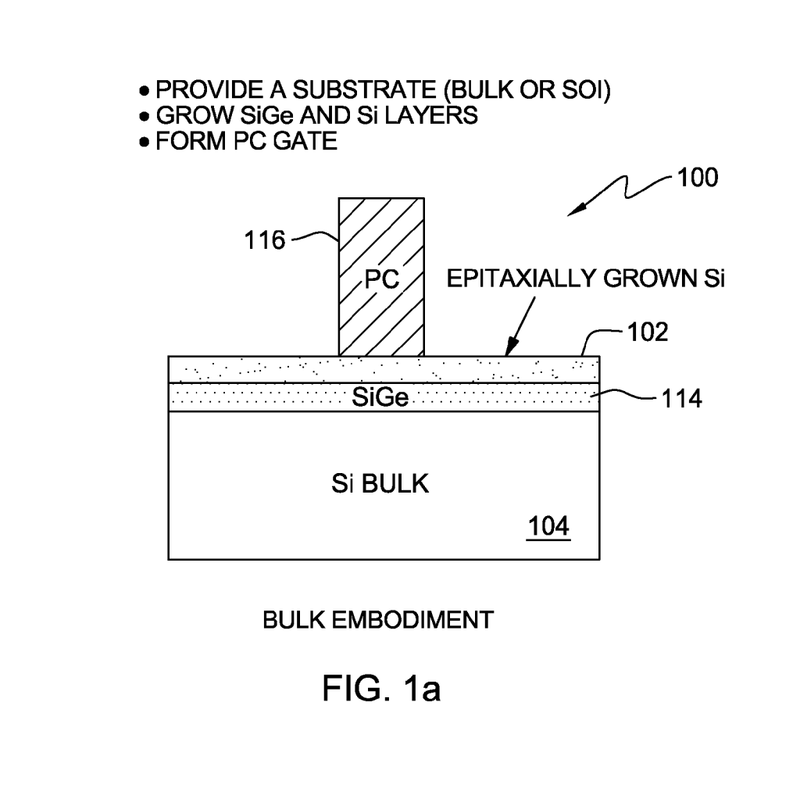
FIG. 1a illustrates an initial structure used in one embodiment of the present invention, where the structure includes a bulk Si semiconductor.

FIGS. 1a-1g and 2a-2g show two embodiments of the present invention. FIGS. 1a-1g illustrate a device 100, and a method of fabricating the device, including an extremely thin silicon layer 102 above a bulk semiconductor substrate 104. FIGS. 2a-2g illustrate a device 200 including an extremely thin silicon layer 202 above a substrate 204. This substrate 204, in turn, includes semiconductor layers 206 and 210 and insulating layer 212, such as a buried oxide (BOX) layer. FIGS. 1a and 2a also show a SiGe layer 114, 214 directly beneath the silicon layers 102, 202, and a gate 116, 216 extending upward from layers 102, 202.

With reference to FIG. 1a, substrate 104 typically is Si although other suitable semiconductor materials may be used. For example, SiC, SiGe, SiGeC, Si alloys, Ge, Ge alloys, GaAs, InAs, and InP, as well as other III/V and II/VI compound semiconductors, may be used.

With reference to FIG. 2a, semiconductor layers 206 and 210 also typically are Si, although other suitable semiconductor materials may be used. For example, SiC, SiGe, SiGeC, Si alloys, Ge, Ge alloys, GaAs, InAs, and InP, as well as other III/V and II/VI compound semiconductors, may be used.

The dielectric layer 212 present in device 200 may be formed in any suitable way. For instance, layer 212 may be formed by implanting a high-energy dopant into the substrate 204 and then annealing the structure to form a buried insulating layer, i.e., dielectric layer 212. In another embodiment, the dielectric layer 212 may be deposited or grown prior to the formation of the silicon layer 210. In yet another embodiment, the substrate 204 may be formed using wafer-bonding techniques, where a bonded wafer pair is formed utilizing glue, adhesive polymer, or direct bonding.

Generally, the two devices 100 and 200, and the processes by which they are fabricated, are basically similar, with the exception that the device 200 includes the above-mentioned insulating layer 212 and silicon layer 210 on top of that insulating layer.

In both of these devices 100, 200, the semiconductor layer 102, 202 has a thickness of less than 10 nm, and the devices are fabricated without using ion implantation to provide the source and drain regions and the extensions regions of the semiconductor device. It has been determined, as mentioned above, that when implanting dopants into semiconductor layers that have a thickness of 10 nm or less, the ion implantation amorphizes the semiconductor layer. Recrystallizing the amorphous semiconductor layer is difficult, because of the limited amount of crystal seed layer that is available in semiconductor layers having a thickness of less than 10 nm that have been ion implanted into an amorphous crystal structure. The presence of an amorphous semiconductor material in a semiconductor device results in the semiconductor device having a high external resistance.

Further, the resistance of the semiconductor device is increased by defects in the semiconductor layer that are produced by ion implantation. The ion implantation may also damage the gate dielectric. In one embodiment, the invention disclosed herein overcomes the disadvantages that result from ion implantation, by forming the source and drain regions in an extremely thin silicon layer, i.e., semiconductor layer 102, 202, using an in-situ doped epitaxial semiconductor growth process followed by an annealing process. The annealing process drives the dopant from the in-situ doped epitaxial semiconductor material 102, 202, i.e., in-situ doped epitaxial semiconductor raised source and drain regions, to provide extension regions.

The fabrication of both devices 100 and 200 may start with a respective substrate 104 and 204. In both embodiments, a SiGe layer 114, 214 is formed at the top of the initial substrate 104, 204, and a Si layer 102, 202 is epitaxially grown on top of the SiGe layer.

In one embodiment, germanium ions are implanted into substrates 104, 204 to form a disposable SiGe layer 114, 214. Any suitable procedure may be used to do this, and for example, in an embodiment, the dose of the germanium ion implant is approximately $10^{15}/cm^2$, and the energy of the germanium ion implant is less than 200 KeV. In another embodiment, the disposable SiGe layer 114, 214 is formed by epitaxially growing SiGe on the substrate 104, 204, respectively.

The Ge content of the SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In one embodiment, the epitaxial grown SiGe produces a compressive strain in a portion of the layer 102, 202, in which the channel of a semiconductor device, such as a pFET device, is subsequently formed.

The extremely thin silicon (ETS) layers 102, 202 are epitaxially grown on the SiGe layers 114, 214. The ETS layers 102, 202 may comprise any semiconducting material including, but not limited to Si, strained Si, SiC, SiGe, SiGeC, Si alloys, Ge, Ge alloys, GaAs, InAs, and InP, or any combination thereof. In one embodiment, the ETS layer 102, 202 has a thickness ranging from 1.0 nm to 10.0 nm. In another embodiment, the ETS layer 102, 202 has a thickness ranging from 1.0 nm to 5.0 nm. In a further embodiment, the ETS layer has a thickness ranging from 3.0 nm to 8.0 nm.

As mentioned above, layers 102 and 202 are undoped or in-situ doped semiconductor materials formed on exposed surfaces of SiGe layers 114, 214. In one embodiment, the in-situ doped semiconductor material 102, 202 is formed using an epitaxial growth process. When the chemical reactants are controlled and the system parameters set correctly, the depositing atoms arrive at the surface of the layer 114, 214 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon.

A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. Although a higher temperature typically results in faster deposition, the faster deposition may result in crystal defects and film cracking.

In one embodiment, the in-situ doped semiconductor material 102, 202 is doped with a first conductivity type dopant during the epitaxial growth process. In one embodiment, the in-situ doped semiconductor material 102, 202 provides the raised source and drain regions of a semiconductor device. P-type MOSFET devices are produced by doping the in-situ doped semiconductor material 102, 202 with elements from group III of the Periodic Table of Elements. In one embodiment, the group III element is boron, aluminum, gallium or indium. In one example, in which the in-situ doped semiconductor material 102, 202 is doped to provide a p-type conductivity, the dopant may be boron present in a concentration ranging from $1 \times 10^{18}$ atoms/cm$^3$ to $2 \times 10^{21}$ atoms/cm$^3$.

In one embodiment, the in-situ doped semiconductor material 102, 202 is doped with a second conductivity type dopant during the epitaxial growth process. In one embodiment, the in-situ semiconductor material 102, 202 provides the raised source and drain regions of a semiconductor device, in which n-type MOSFET devices are produced by doping the in-situ doped semiconductor material 102, 202 with elements from group V of the Periodic Table of Elements. In one embodiment, the group V element is phosphorus, antimony or arsenic.

FIGS. 1a and 2a also depict a gate structure 116, 216 formed directly on the first semiconductor layer 102, 202, in accordance with one embodiment of the present invention. The gate structure 116, 216 can be formed using deposition, photolithography, and a selective etching process. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions.

In one embodiment, a hard mask (hereafter referred to as a dielectric cap) may be used to form the gate structure 116, 216. The dielectric cap may be formed by first depositing a dielectric hard mask material, like silicon nitride or silicon oxide, atop a layer of gate electrode material and then applying a photoresist pattern to the hard mask material using a lithography process. The photoresist pattern is then transferred into the hard mask material using a dry etch process forming the dielectric cap. Next the photoresist pattern is removed and the dielectric cap pattern is then transferred into the gate electrode material during a selective etching process. The dielectric cap may be removed by a wet or dry etch prior to a silicide process. Alternatively, the gate structure 116, 216 can be formed by other patterning techniques such as spacer image transfer.

The gate structures 116, 216 may include at least a gate conductor atop a gate dielectric. This gate conductor, in turn, may be a metal gate electrode and a second conductive material atop the metal gate electrode. The metal gate electrode may be any conductive metal including, but not limited to, W, Ni, Ti, Mo, Ta, Cu, Pt, Ag, Au, Ru, Ir, Rh, and Re, and alloys that include at least one of the aforementioned conductive elemental metals. In one example, the second conductive material atop the metal gate electrode may be a doped semiconductor material, such as a doped silicon containing material, e.g., doped polysilicon. When a combination of conductive elements is employed, an optional diffusion barrier material such as TaN or WN may be formed between the conductive materials.

The gate conductor of the gate structure 116, 216 is typically present on a gate dielectric that may be, for example, a dielectric material, such as silicon oxide, or alternatively high-k dielectrics, such as oxides of Ta, Zr, Al or combinations thereof. In another embodiment, the gate dielectric is comprised of an oxide, such as silicon oxide, $ZrO_2$, $Ta_2O_5$ or $Al_2O_3$. In one embodiment, the gate dielectric has a thickness ranging from 1 nm to 10 nm. In another embodiment, the gate dielectric has a thickness ranging from 1.5 nm to 5 nm.

Figure 1B:
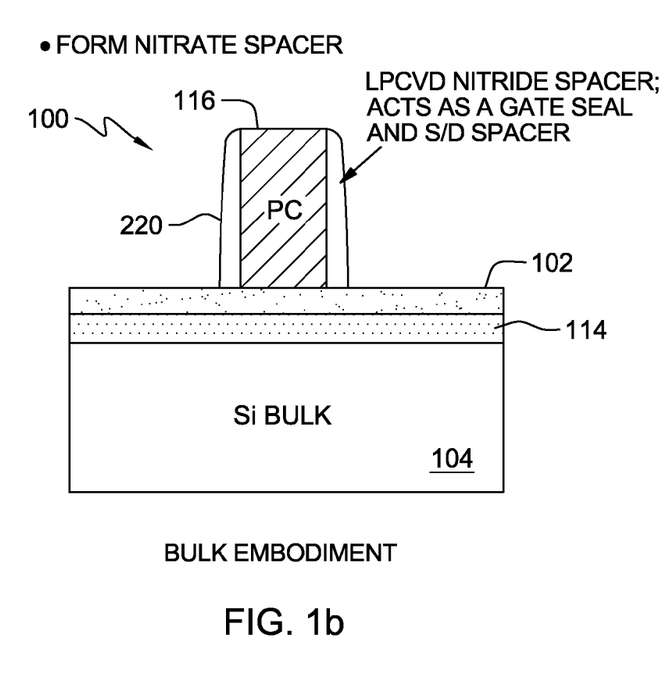
Figure 2A:
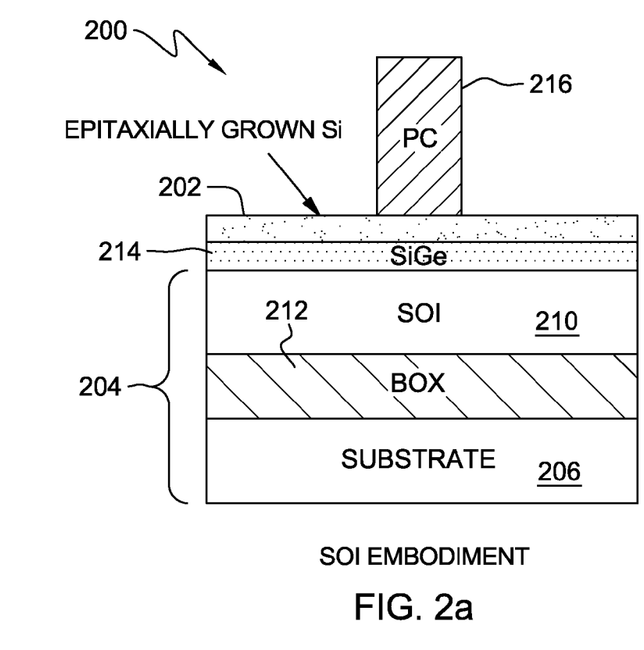
FIG. 2a shows an initial structure used in a second embodiment of the invention, where the structure includes a SOI substrate.
Figure 2B:
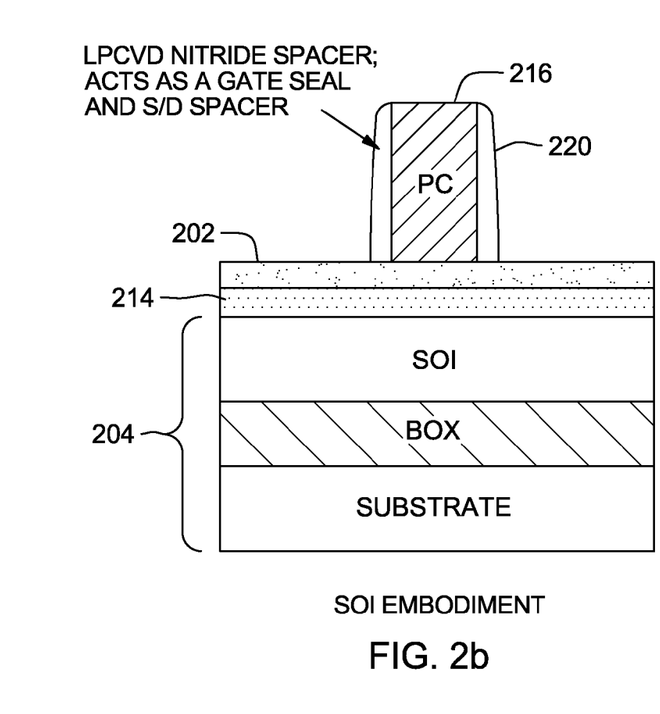

FIGS. 1b and 2b depict first spacers 120, 220 formed in direct contact with the sidewalls of the gate structures 116, 216. The first spacers 120, 220 are typically narrow, having a width ranging from 2.0 nm to 15.0 nm. The first spacers 120, 220 can be formed using deposition and etch processing steps. The first spacers 120, 220 may be composed of a dielectric, such as nitride, oxide, oxynitride, or a combination thereof. The thickness of the first spacers 120, 220 determines the proximity of the subsequently formed raised source/drain (RSD) regions to the channel of the devices 100, 200.

Figure 1C:
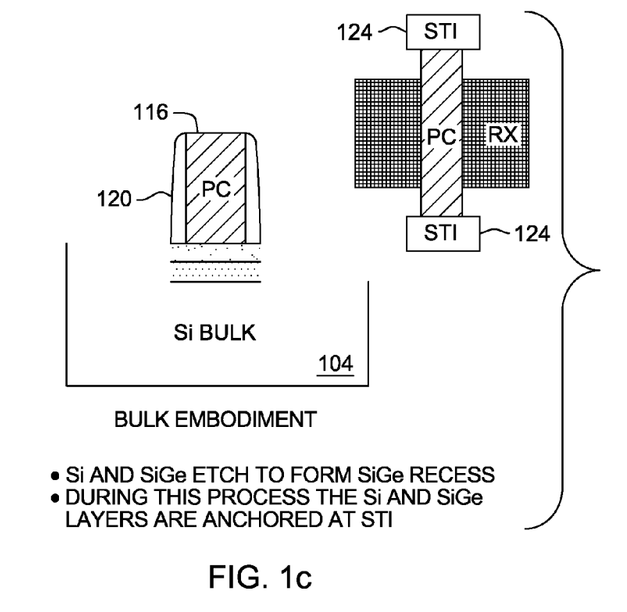
Figure 2C:
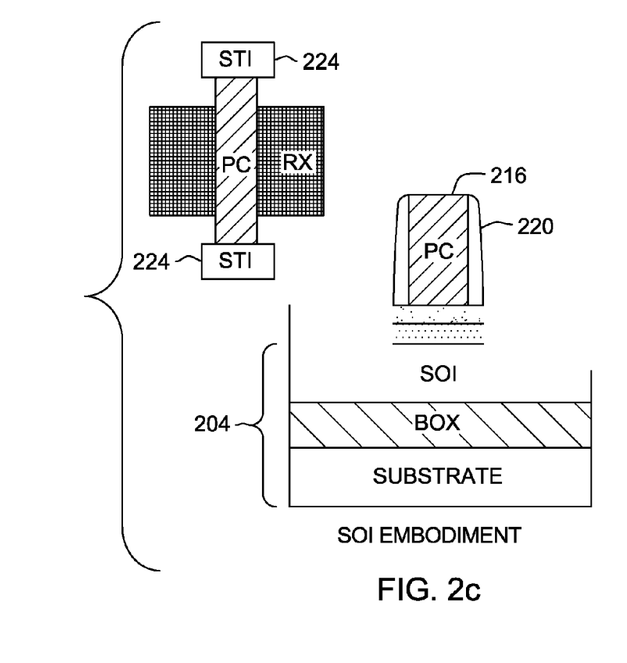

With reference to FIGS. 1c and 2c, shallow trench isolation (STI) regions, represented at 124, 224, are formed in devices 100 and 200, on either sides of gates 120 and 220. Any suitable procedure may be used to form these trenches. In one embodiment, the STI regions 124, 224 are formed in the substrate 104, 204 and filled with dielectric material, such as silicon oxide. Other types of isolation regions may also be used. STI can be formed before the formation of gate structure 116, 216.

Trenches 124 and 224 may be formed, for example, by lithography and etching. The lithography step includes applying a photoresist to the surface of the device substrate, exposing the photoresist, and developing the exposed photoresist using a conventional resist developer. The etching step used in forming the trenches 124, 224 may include, for example, any standard Si directional reactive ion etch process. Other dry etching processes such as plasma etching, ion beam etching and laser ablation may also be employed. Portions of the layer 102, 202 that are protected by the patterned photoresist are not removed during etching. After etching, the patterned photoresist is removed utilizing a conventional resist stripping process.

Figure 1D:
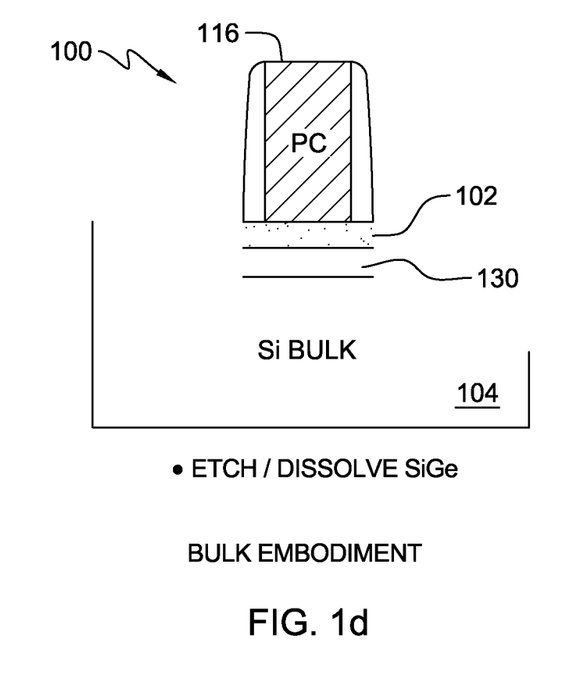
Figure 2D:
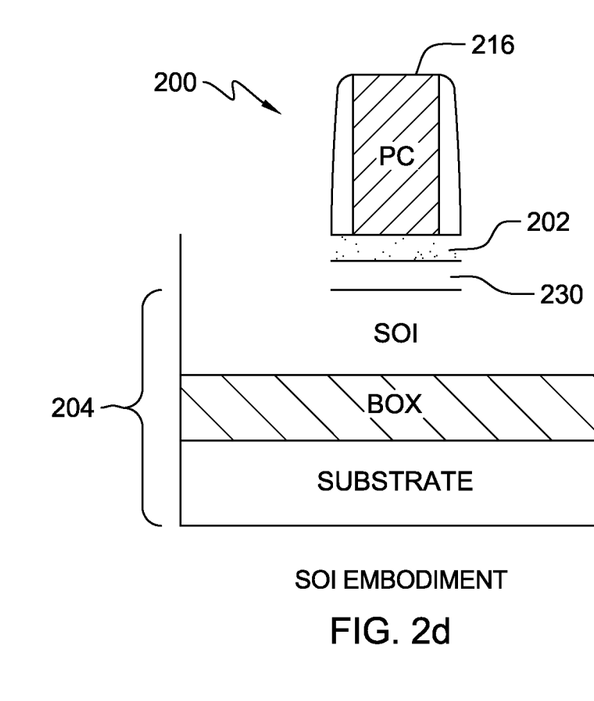

SiGe underlayers 114, 214 are dissolved to form silicon-on-nothing, and any suitable procedure may be employed to do this. For example, access to the SiGe underlayers 114, 214 may be provided by a selective etching of the isolation trenches 124, 224 until lateral access is provided to the SiGe layers. This etching may be performed in a conventional manner, for example by an anisotropic plasma etch. The process then continues, as illustrated in FIGS. 1d and 2d, with the removal of the SiGe layer by selective lateral etching. SiGe can be removed, either by oxidizing chemistry (such as by etching with a solution having 40 ml of 70% $HNO_3$+20 ml of $H_2O_2$+5 ml of 0.5% HF) or by isotropic plasma etching. During this process, the Si layers 102, 202 and the SiGe layers 114, 214 are anchored at the STI regions.

FIGS. 1d and 2d illustrate perspective views of the devices 100 and 200 after the etching of the trenches and lateral etching of the SiGe or Ge layer 114, 214. There is a void 130, 230 under the silicon epitaxial layer 102, 202, inside or on top of the initial substrate 104, 204. Supports (not shown) may be located around the perimeter of the void 130, 230 at predetermined intervals to maintain the structure.

Figure 1E:
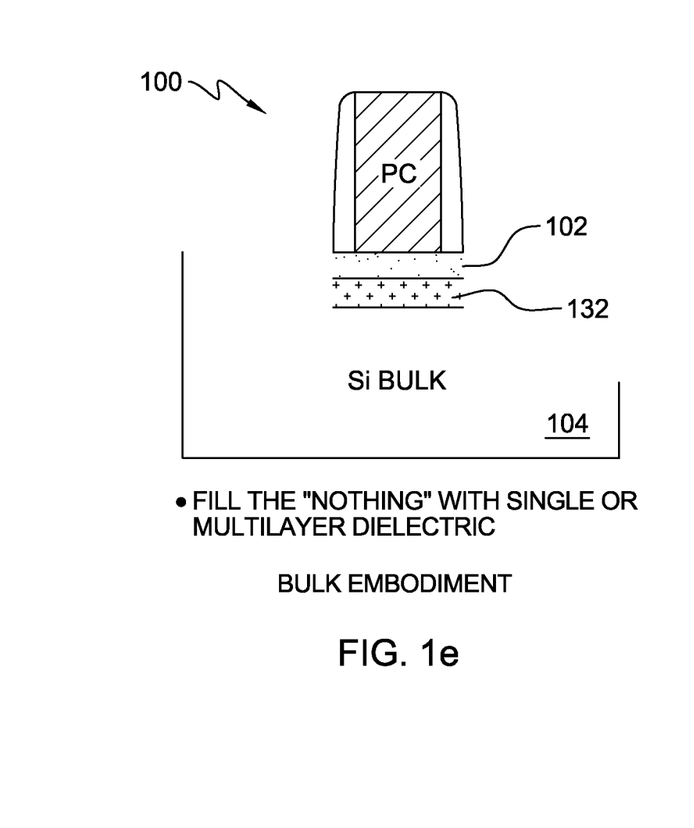
FIGS. 1e and 2e show the voids that are formed when the SiGe layers are removed.
Figure 2E:
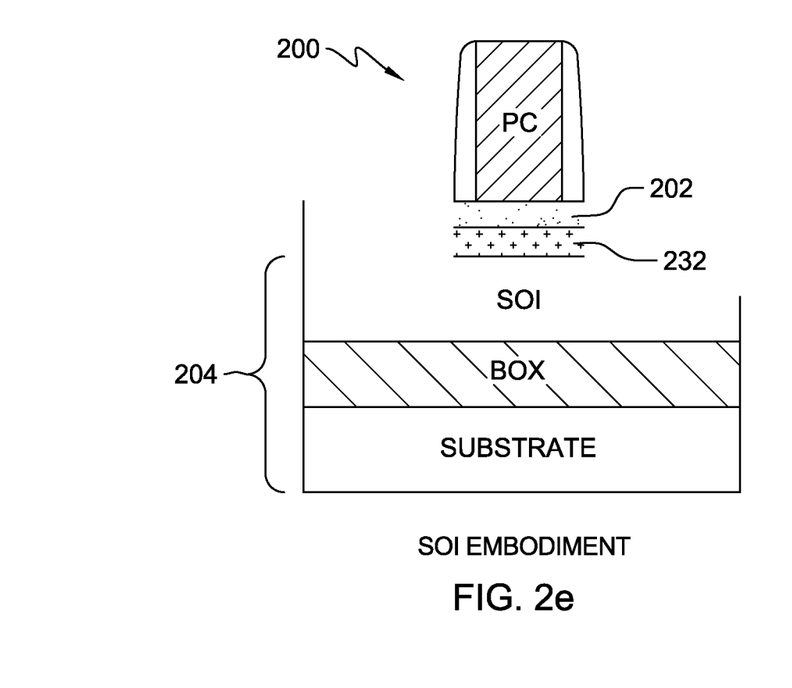

With reference to FIGS. 1e and 2e, the voids 130, 230 are then filled with a dielectric 132, 232 for the purpose of achieving an epitaxial SOI layer. Any suitable dielectric may be used, and for instance, silicon oxide may be used. The dielectric layer 132, 232 may be formed by thermal oxidation of the silicon layer, by a conventional deposition process, or else by a hybrid process. In one embodiment, the surfaces forming the voids 130, 230 may be passivated by thermal oxidation, and then the voids 130, 230 may be completely filled with a dielectric different from silicon oxide, such as silicon nitride. The process then continues with the filling of the trenches 124, 224 with a dielectric. This dielectric may be the same as that used in the STI process.

Figure 1F:
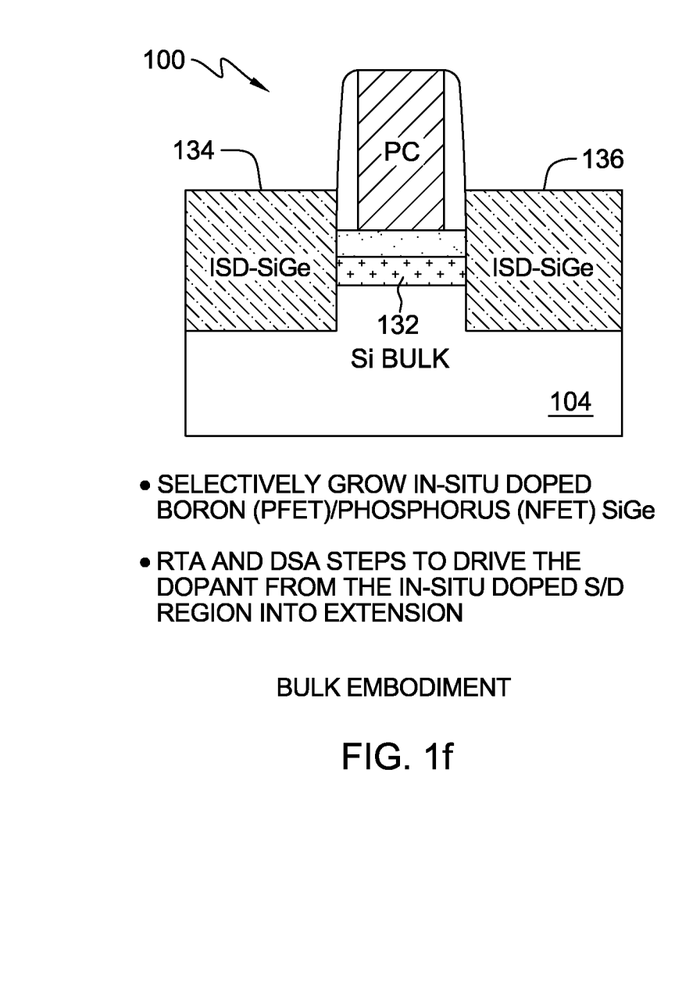
FIGS. 1f and 2f depict doped source and drain regions that are grown on the structures of FIGS. 1e and 2e.
Figure 2F:
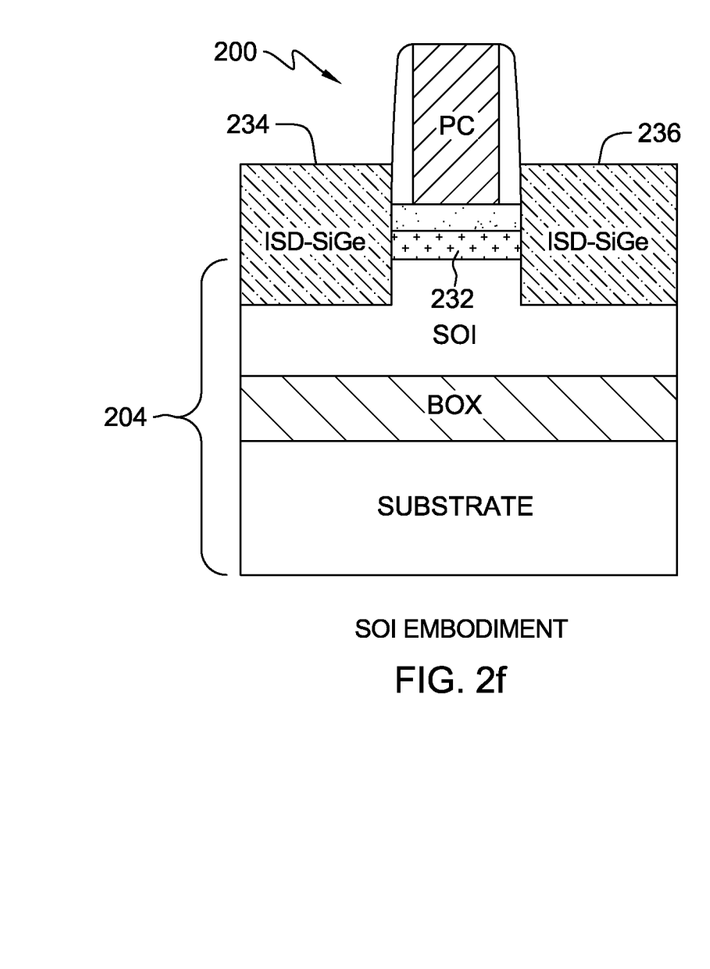

As illustrated in FIGS. 1f and 2f, in-situ doped source regions 134, 234 and drain regions 136, 236 are then grown on substrates 104, 204, and any suitable procedure may be used to grow these regions. For example, to form an N-type region, the region may be grown with elements from group V of the Periodic Table of Elements, such as phosphorus, antimony or arsenic. To form a P-type region, the region may be grown with elements, such as boron, aluminum, gallium or indium, from group III of the Periodic Table of Elements.

Figure 1G:
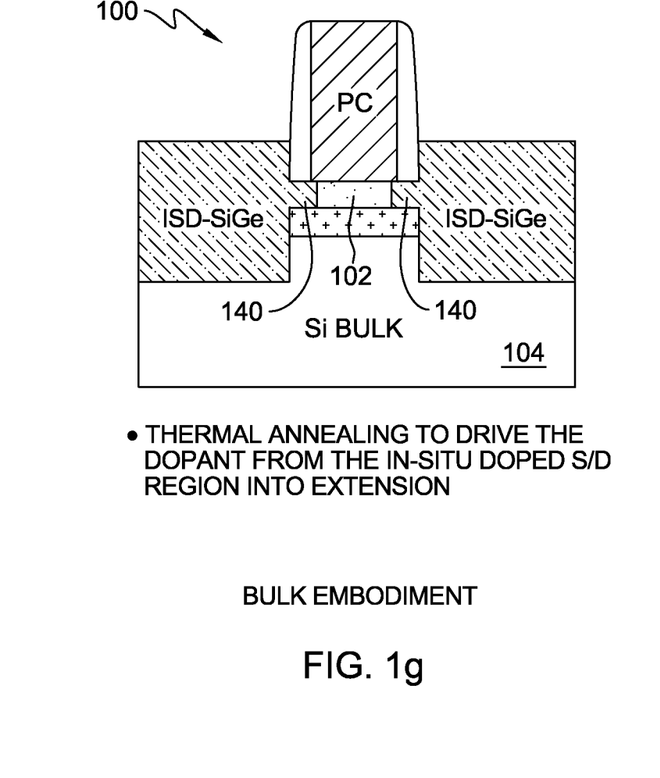
FIGS. 1g and 2g show doped extension regions that are formed in the structures of FIGS. 1f and 2f.
Figure 2G:
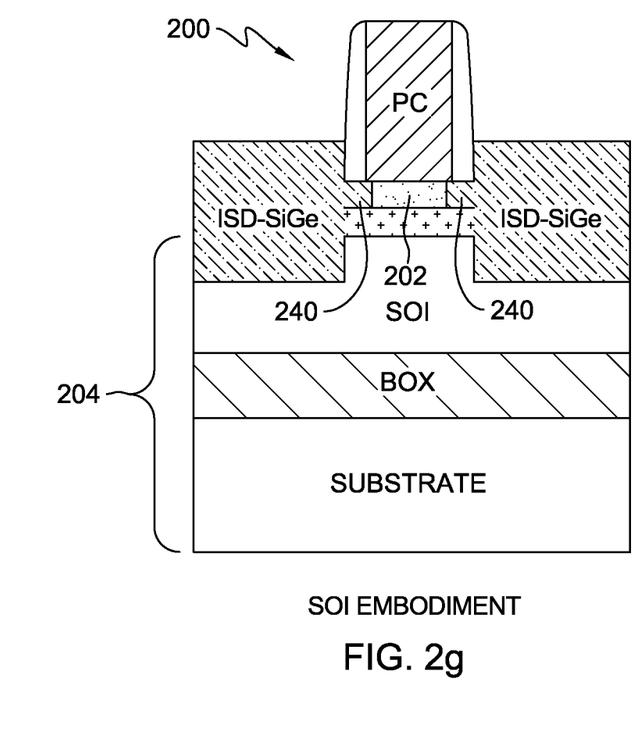

An annealing process is used to drive dopant from the in-situ doped source regions 134, 234 and drain regions 136, 236 into the ETSOI layers 102, 202 to form extension regions, shown at 140, 240 in FIGS. 1g and 2g. In one embodiment, the dopant from the source and drain regions is diffused into the ETSOI layers 102, 202 by an annealing process including, but not limited to: rapid thermal annealing, furnace annealing, flash lamp annealing, laser annealing, or any suitable combination thereof. In one embodiment, thermal annealing to diffuse the dopant into the ETSOI layer 102, 202 is conducted at a temperature ranging from about 850° C. to about 1350° C.

In one embodiment, the extension regions 140, 240 that are formed in the ETSOI layer 102, 202 have a p-type conductivity. Typically, the dopant concentration of the extension regions having the p-type conductivity ranges from $1\times10^{19}$ atoms/cm$^3$ to $2\times10^{21}$ atoms/cm$^3$. In another embodiment, the extension regions 45 have the p-type conductivity ranging from $2\times10^{19}$ atoms/cm$^3$ to $5\times10^{20}$ atoms/cm$^3$.

In another embodiment, in which the source and drain regions are doped to an n-type conductivity, the extension regions 140, 240 that are formed in the ETSOI layer 102, 202 have an n-type conductivity. Typically, the dopant concentration of the extension regions having the n-type conductivity ranges from $1\times10^{19}$ atoms/cm$^3$ to $2\times10^{21}$ atoms/cm$^3$. In another embodiment, the extension regions have the p-type conductivity ranging from $2\times10^{19}$ atoms/cm$^3$ to $5\times10^{20}$ atoms/cm$^3$.

In one embodiment, the extension regions 140, 240 have a depth that extends the entire depth of the ETSOI layer 102, 202. Therefore, the extension regions have a depth of less than 10 nm, typically being 3 nm to 8 nm in depth, as measured from the upper surface of the ETSOI layer 102, 202.

Additional processing steps, if desired or appropriate, may be performed. For example, silicides may be formed on the raised source and drain regions of the device, i.e., the in-situ doped semiconductor material 102, 202. Silicide formation typically requires depositing a refractory metal such as cobalt, nickel, or titanium onto the surface of a Si-containing material. Following deposition, the structure is subjected to an annealing step using conventional processes such as, but not limited to, rapid thermal annealing. During thermal annealing, the deposited metal reacts with Si forming a metal silicide. The remaining unreacted metal is removed by an etch process selective to silicides and spacers 120, 220. A gate silicide may also be formed on the gate conductor.

Following silicide formation, a layer of dielectric material can be blanket deposited atop the entire substrate and pla-narized. The blanket dielectric may be selected from the group comprising silicon-containing materials such as silicon oxide, silicon nitride, silicon oxynitride, carbon-containing silicon, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the blanket dielectric include: any of the aforementioned materials in porous form, or in a form that changes during processing to or from being porous and/or permeable to being non-porous and/or non-permeable.

The deposited dielectric is then patterned and etched to form via holes to the various source/drain and gate conductor regions of the device. Following via formation interconnects may be formed by depositing a conductive metal into the via holes using deposition methods, such as CVD or plating. The conductive metal may include, but is not limited to: tungsten, copper, aluminum, silver, gold and alloys thereof.

The above process may provide a planar semiconductor device that includes a substrate having an extremely thin layer of semiconductor material 102, 202 atop an insulating layer, wherein the layer of semiconductor material has a thickness of less than 10.0 nm. A gate structure 116, 126 is present on the semiconductor material. The planar semiconductor device includes doped epitaxial raised source and drain regions (in-situ doped semiconductor material 102, 202) that are present atop the semiconductor material, and extension diffusions 140, 240 extending from the doped epitaxial raised source and drain regions into the semiconductor material.

While it is apparent that the invention herein disclosed is well calculated to fulfill objects discussed above, it will be appreciated that numerous modifications and embodiments may be devised by those skilled in the art, and it is intended that the appended claims cover all such modifications and embodiments as fall within the true spirit and scope of the present invention.

What is claimed is:

1. A semiconductor device comprising:
    a semiconductor substrate;
    a epitaxially grown semiconductor layer above said substrate, said semiconductor layer having a thickness less than about 10 nm;
    a gate extending from said semiconductor layer;
    in-situ doped source and drain regions adjacent the semiconductor layer;
    a dielectric material formed on said substrate, in an area between the substrate and said semiconductor layer; and
    a plurality of isolation regions extending from the semiconductor substrate, on laterally opposite ends of the dielectric material, and providing lateral access to said area, in which the dielectric material is formed, between the substrate and semiconductor layer.

2. The semiconductor device according to claim 1, wherein the semiconductor layer has a thickness from about 1 nm to 5 nm.

3. The semiconductor device according to claim 1, wherein the semiconductor layer has a thickness from about 3 nm to 8 nm.

4. The semiconductor device according to claim 1, wherein the semiconductor layer is comprised of Si.

5. The semiconductor device according to claim 1, wherein a doped extension region is formed in the semiconductor layer beneath said gate, and the doped extension region is in direct contact with said gate and said dielectric material.

6. The semiconductor device according to claim 1, wherein the source and drain regions are on opposite lateral sides of the semiconductor layer.

7. The semiconductor device according to claim 6, wherein doped extension regions are formed in lateral ends of the semiconductor layer.

8. The semiconductor device according to claim 7, wherein a first of the doped extension region extends into the semiconductor layer from the source region, and a second of the doped extension region extends into the semiconductor layer from the drain region.

9. The semiconductor device according to claim 8, wherein the doped extension regions are directly above the dielectric material.

10. The semiconductor device according to claim 1 wherein the semiconductor layer is comprised of atoms having a defined, uniform orientation.

11. A semiconductor device comprising:
a semiconductor substrate;
an epitaxially grown Si layer above said substrate, said semiconductor layer having a thickness from about 1 nm to 10 nm;
a dielectric material formed on said substrate, in an area between the substrate and said semiconductor layer;
a plurality of isolation regions extending from the semiconductor substrate, on laterally opposite ends of the dielectric material, and providing lateral access to said area, in which the dielectric material is formed, between the substrate and semiconductor layer;
a gate extending from said semiconductor layer; and
wherein raised, in-situ doped source and drain regions are formed adjacent the Si layer, and a doped extension region is formed in the Si layer beneath said gate, and the doped extension region is in direct contact with said gate and said dielectric material.

12. The semiconductor device according to claim 11, wherein the Si layer has a thickness from about 3 nm to 8 nm.

13. The semiconductor device according to claim 11, wherein the Si layer has a thickness from about 3 nm to 5 nm.

14. The semiconductor device according to claim 11, wherein the Si layer is an in-situ doped Si layer.

15. The semiconductor device according to claim 14, wherein the extension regions have a depth that extends the entire depth of the Si layer.

16. The semiconductor device according to claim 11, wherein the source and drain regions are on opposite lateral sides of the semiconductor layer.

17. The semiconductor device according to claim 16, wherein the doped extension region is formed in lateral ends of the semiconductor layer.

18. The semiconductor device according to claim 17, wherein the doped extension region includes a first doped extension region extending into the semiconductor layer from the source region, and a second doped extension region extending into the semiconductor layer from the drain region.

19. The semiconductor device according to claim 18, wherein the doped extension regions are directly above the dielectric material.

20. The semiconductor device according to claim 11 wherein the semiconductor layer is comprised of atoms having a defined, uniform orientation.

* * * * *